United States Patent
Kaya et al.

(10) Patent No.: US 6,797,935 B2
(45) Date of Patent: Sep. 28, 2004

(54) METHOD OF CHARGING THE PHOTODIODE ELEMENT IN ACTIVE PIXEL ARRAYS

(75) Inventors: Cetin Kaya, Plano, TX (US); Julian Chen, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 209 days.

(21) Appl. No.: 10/251,732

(22) Filed: Sep. 20, 2002

(65) Prior Publication Data

US 2003/0080358 A1 May 1, 2003

Related U.S. Application Data

(60) Provisional application No. 60/336,479, filed on Oct. 30, 2001.

(51) Int. Cl.[7] .................................................. H01L 31/00
(52) U.S. Cl. ................................ 250/214.1; 250/214 R
(58) Field of Search ........................... 250/214.1, 214 R, 250/208.1; 348/294, 296, 301, 311; 257/443, 444, 291

(56) References Cited

U.S. PATENT DOCUMENTS 6,225,670 B1 * 5/2001 Dierickx ...................... 257/431

* cited by examiner

*Primary Examiner*—Que T. Le
(74) *Attorney, Agent, or Firm*—Alan K. Stewart; W. James Brady, III; Frederick J. Telecky, Jr.

(57) ABSTRACT

A forward biased diode 40 is used to charge up a photodiode 26 rather than an NMOS transistor. This photodiode charging mechanism increases the dynamic range and optical response of active pixel arrays, and improves the scalability of the pixel element.

14 Claims, 1 Drawing Sheet

METHOD OF CHARGING THE PHOTODIODE ELEMENT IN ACTIVE PIXEL ARRAYS

This application claims priority under 35 USC §119 (e) (1) of provisional application No. 60/336,479 filed Oct. 30, 2001.

FIELD OF THE INVENTION

This invention generally relates to electronic systems and in particular it relates to charging the photodiode element in active pixel arrays.

BACKGROUND OF THE INVENTION

A prior art active pixel light sensing element is shown in FIG. 1. This state of the art active pixel element consists of three NMOS transistors 20, 22, and 24, and a photodiode 26. One of these transistors is called a reset transistor 20 and its function is to charge up the photodiode 26 (nwell) to a preset value at the beginning of each exposure cycle. The reset operation is needed in order to eliminate memory effect from prior exposure.

Biasing conditions used in state of the art 0.18 um technology are as follows: Nwell photodiode 26 is charged up to 2 V during reset. In order to pass 2 V through the NMOS transistor 20, a voltage of 3.3 V (+/−10%) is applied on the gate. When the reset transistor 20 is turned off (gate goes to 0 V), nwell potential at node 32 is pushed down by approximately 100 mV due to charge injection.

Referring to FIG. 1 showing the conventional pixel architecture, the dynamic range at the column output node 30 is calculated as follows:

(1) nwell 26 is charged to 2000 mV when transistor 20 is turned on;
(2) nwell 26 goes to 1900 mV due to charge injection when reset transistor 20 is turned off;
(3) voltage at the source 34 of sense transistor 22 (sense device) is 800 mV=1900 mV−nmos Vt {1100 mV with back bias} (nmos Vt is the threshold voltage of transistor 22);
(4) minimum voltage drop allocated for the current source transistor 28 is 200 mV;
(5) dynamic range at column output node 30 is 600 mV=800 mV−200 mV;
(6) there is no significant voltage drop across column select transistor 24 (column select device).

One of the limitations of this prior art approach (combined with high voltage sense transistor 22) is that dynamic range is limited to 500 mV if the gate voltage on the reset transistor 20 drops to 3.0 V.

SUMMARY OF THE INVENTION

A forward biased diode is used to charge up a photodiode rather than an NMOS transistor. This photodiode charging mechanism increases the dynamic range and optical response of active pixel arrays, and improves the scalability of the pixel element.

DESCRIPTION OF PREFERRED EMBODIMENTS

Figure 2:
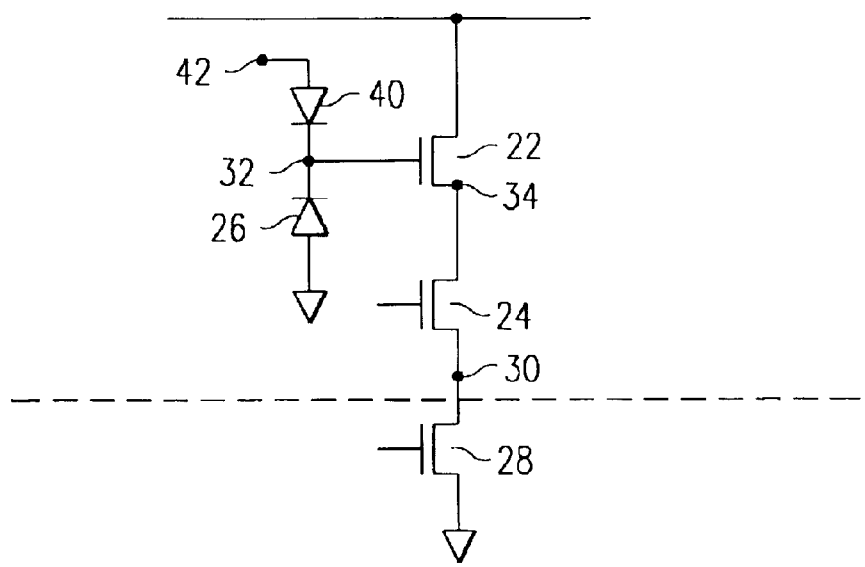
FIG. 2 is a schematic circuit diagram of a preferred embodiment active pixel light sensing element which uses a forward biased diode to charge the photodiode.

Shown in FIG. 2 is a preferred embodiment photodiode charging mechanism that increases the dynamic range and optical response of active pixel arrays. In addition, this charging mechanism improves the scalability of the pixel element.

Figure 1:
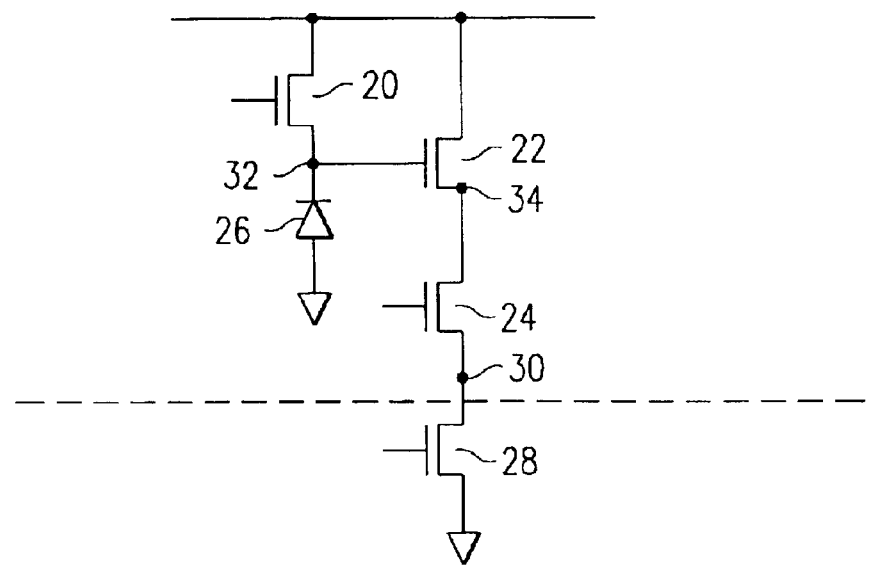
FIG. 1 is a schematic circuit diagram of a prior art active pixel light sensing element.

In the preferred embodiment device of FIG. 2, a forward biased p+ to nwell junction (reset diode 40) is used to charge up the nwell photodiode 26 rather than an NMOS transistor 20 of FIG. 1. P+ diode 40 is placed over the photodiode area. This is shown in FIG. 2. In this scheme, the sequence of events during reset are as follows:

(1) Node 42 (p+ of reset diode 40) is pulled to 3.3 V. This forward biases reset diode 40 (p+ to nwell junction) Floating nwell potential at node 32 is charged up to approximately 2.75 V.
(2) To turn off reset, node 42 is pulled to ground. This pushes down nwell potential at node 32 to approximately 2.35 V while p+/nwell diode 40 discharges.
(3) The voltage at the source 34 of transistor 22 will be 1250 mV.
(4) The minimum voltage drop allocated for the current source transistor 28 is 200 mV.
(5) The dynamic range at the column output node 30 will be 1050 mV=1250 mV−200 mV. This represents more than a 50% increase in the dynamic range from that of the prior art device of FIG. 1.

The preferred embodiment circuit of FIG. 2 provides several advantages:

(1) The dynamic range is increased by more than 50%.
(2) P+ diode 40 takes less area to build than that of a 3.3 V transistor 20. As a result, more pixel area will be open to light. This improves the optical sensitivity of the pixel.
(3) P+ diode 40 will scale with advancing technology. However, a reset transistor 20 supporting higher voltages will not scale.
(4) Blooming (due to very strong light) can be suppressed by biasing up the p+ diode 40 to approximately 0.6 V during reset off phase.

Simulations reveal that nwell photodiode 26 can be charged up to approximately 2.76 V within 0.1 microseconds. One area of concern with this type of structure would be the amount of charge injected into the substrate due to parasitic bipolar effect (p+/nwell/p-sub). Simulations reveal that for a unity gain bipolar, the charge transfer efficiency from p+ diode to nwell is approximately 35%.

When p+ diode 40 is turned off, nwell potential at node 32 is pushed down by approximately 400 mV. Most of the charge exchange is between p+ and nwell (70%).

While this invention has been described with reference to an illustrative embodiment, this description is not intended to be construed in a limiting sense. Various modifications of the illustrative embodiment, as well as other embodiments of the invention, will be apparent to persons skilled in the art upon reference to the description. It is therefore intended that the appended claims encompass any such modifications or embodiments.

What is claimed is:

1. A light sensing device comprising:
   a photodiode;
   a sense device coupled to the photodiode; and
   a reset diode having a first end coupled to the photodiode and having a second end at a first voltage while resetting the photodiode and at a second voltage while not resetting the photodiode.

2. The device of claim 1 wherein the sense device is a transistor having a control node coupled to the photodiode.

3. The device of claim 1 further comprising a column select device coupled to the sense device.

4. The device of claim 3 wherein the column select device is a transistor.

5. The device of claim 3 further comprising a current source coupled to the column select device.

6. The device of claim 5 wherein the current source is a transistor.

7. The device of claim 1 wherein the first voltage is higher than the second voltage.

8. The device of claim 1 wherein the second voltage is at a level that suppresses blooming.

9. The device of claim 1 wherein the photodiode is an nwell photodiode.

10. A method for resetting a photodiode in an active pixel device comprising:

providing a reset diode coupled to the photodiode;

pulling the reset diode to a first voltage level for resetting the photodiode; and pulling the reset diode to a second voltage level after resetting the photodiode.

11. The method of claim 10 further comprising sensing a voltage level on the photodiode with a sense device.

12. The method of claim 11 further comprising selecting the sense device with a column sense device.

13. The method of claim 12 further comprising providing a current to the column sense device.

14. The method of claim 10 wherein the first voltage level is higher than the second voltage level.

* * * * *